United States Patent
Takamura et al.

(10) Patent No.: US 11,414,745 B2
(45) Date of Patent: Aug. 16, 2022

(54) SPUTTERING TARGET-BACKING PLATE ASSEMBLY AND PRODUCTION METHOD THEREOF

(71) Applicant: JX Nippon Mining & Metals Corporation, Tokyo (JP)

(72) Inventors: Hiroshi Takamura, Ibaraki (JP); Ryosuke Sakashita, Ibaraki (JP)

(73) Assignee: JX Nippon Mining & Metals Corporation, Tokyo (JP)

(*) Notice: Subject to any disclaimer, the term of this patent is extended or adjusted under 35 U.S.C. 154(b) by 189 days.

(21) Appl. No.: 15/937,940

(22) Filed: Mar. 28, 2018

(65) Prior Publication Data
US 2018/0282859 A1    Oct. 4, 2018

(30) Foreign Application Priority Data
Mar. 31, 2017  (JP) .............. JP2017-072304

(51) Int. Cl.
C23C 14/34 (2006.01)
H01J 37/34 (2006.01)
B23K 35/26 (2006.01)
B23K 20/10 (2006.01)

(52) U.S. Cl.
CPC .......... *C23C 14/3407* (2013.01); *B23K 35/26* (2013.01); *B23K 35/262* (2013.01); *H01J 37/3426* (2013.01); *H01J 37/3435* (2013.01); *B23K 20/10* (2013.01)

(58) Field of Classification Search
CPC .............. H01J 37/3426; H01J 37/3435; H01J 37/3491; C23C 14/14; C23C 14/3407; C23C 14/3414; B23K 35/262; B23K 35/26; B23K 20/10
See application file for complete search history.

(56) References Cited

U.S. PATENT DOCUMENTS

| | | | |
|---|---|---|---|
| 5,693,203 A | 12/1997 | Ohhashi et al. | |
| 7,347,353 B2 | 3/2008 | Yamakoshi et al. | |
| 7,459,720 B2 | 12/2008 | Ohmi et al. | |
| 7,998,324 B2 | 8/2011 | Watanabe et al. | |
| 8,157,973 B2 | 4/2012 | Oda et al. | |
| 8,236,428 B2 | 8/2012 | Satoh et al. | |
| 8,252,422 B2 | 8/2012 | Takamura et al. | |
| 8,512,868 B2 | 8/2013 | Suzuki et al. | |
| 8,647,747 B2 | 2/2014 | Takamura et al. | |
| 8,659,022 B2 | 2/2014 | Suzuki et al. | |
| 8,987,737 B2 | 3/2015 | Takamura et al. | |
| 9,053,942 B2 | 6/2015 | Takamura et al. | |
| 9,062,371 B2 | 6/2015 | Koido | |
| 9,566,618 B2 | 2/2017 | Yuan et al. | |
| 10,381,203 B2 * | 8/2019 | Takamura ............... | C22C 27/04 |
| 2010/0016144 A1 | 1/2010 | Suzuki et al. | |
| 2010/0187661 A1 | 7/2010 | Suzuki et al. | |
| 2010/0330325 A1 | 12/2010 | Suzuki et al. | |
| 2012/0318669 A1 | 12/2012 | Ikeda et al. | |
| 2013/0220805 A1 | 8/2013 | Tsukamoto et al. | |
| 2015/0001069 A1 | 1/2015 | Takamura et al. | |
| 2015/0197848 A1 | 7/2015 | Suzuki et al. | |
| 2016/0086777 A1 | 3/2016 | Nagatsu et al. | |
| 2016/0260591 A1 | 9/2016 | Zhang | |
| 2017/0213712 A1 | 7/2017 | Takamura et al. | |

FOREIGN PATENT DOCUMENTS

| | | | | |
|---|---|---|---|---|
| JP | H07-048667 A | | 2/1995 | |
| JP | 10158829 A | * | 6/1998 | ......... C23C 14/3407 |
| JP | 2007-021580 A | | 2/2007 | |
| JP | 2009-242915 A | | 10/2009 | |
| JP | 2016-037621 A | | 3/2016 | |

OTHER PUBLICATIONS

Machine Translation JP 2007021580 A (Year: 2007).*
'Sn—Ag solder alloy melting point'. Indium Corp. [https://www.indium.com/blog/tin-silver-snag-solder-alloy-for-stringing-and-bussing-solar-modules.php#:~:text=Tin%2DSilver%20Solder%20(SnAg)&text=Historically%2C%20its%20melting%20temperature%20(221,processes%20previously%20running%20SnPb%20solders. (Year: 2011).*
'Nanofoil' Safety Data Sheet. Indium Corp. [https://www.indium.com/technical-documents/safety-data-sheets/english/#nanofoil].*
"NanoBond of Ceramic & Metal Sputter Targets". Indium Corporation. (Year: 2008).*
Office Action dated Mar. 2, 2021 in Japanese Application No. 2019-052538.

* cited by examiner

*Primary Examiner* — Michael A Band
(74) *Attorney, Agent, or Firm* — Howson & Howson LLP

(57) ABSTRACT

A sputtering target-backing plate assembly in which a Si sputtering target is bonded to a backing plate by way of a brazing material, wherein the brazing material has a melting point of 200° C. or higher and a bonding strength of 0.16 kgf/cm² or higher. An object is to provide a sputtering target-backing plate assembly in which a Si sputtering target is bonded to a backing plate by way of a brazing material, wherein the sputtering target-backing plate assembly has a high bonding strength and is free from separation even under high temperature sputtering conditions such as during high power sputtering.

8 Claims, No Drawings

SPUTTERING TARGET-BACKING PLATE ASSEMBLY AND PRODUCTION METHOD THEREOF

BACKGROUND

The present invention relates to a sputtering target-backing plate assembly in which a silicon (Si) sputtering target is bonded to a backing plate using a brazing material, and the production method thereof, and particularly relates to a sputtering target-backing plate assembly having a high bonding strength and which is free from separation even under high temperature sputtering conditions such as during high power sputtering, as well as to the production method thereof.

As one method of forming thin films of semiconductor devices, there is a sputtering method. In recent years, demand for the implementation of high power sputtering with increased input power is increasing in order to improve the productivity of devices. This is because, by increasing the power during sputtering, the sputter rate will increase, and the number of wafers that can be subject to deposition treatment per unit time can be consequently increased.

The method of bonding a sputtering target to a backing plate can be broadly classified into two methods. The first method is referred to as a diffusion bonding method in which a sputtering target and a backing plate are joined and mounted in a vacuum, and both materials mutually diffuse and become bonded as a result of undergoing heat treatment under a high pressure and at a moderate temperature.

The second method is referred to as a brazing method in which a low melting point material such as indium is inserted as a brazing material between a target and a backing plate, and the target and the backing plate are thereby joined and bonded. The former diffusion bonding method is advantageous in that the assembly is clean because there is no interposition of a material other than the target material and the backing plate material, and the heatproof temperature of the bonded part is higher in comparison to the case of using the brazing material of the latter brazing method. Thus, the diffusion bonding method is also suitable for high power sputtering, and is being applied to sputtering targets which are mainly formed from metal material such as Ti, Al, Cu, Ta, and Co.

With regard to semiconductor materials such as silicon (Si) and germanium (Ge) and oxide materials such as PZT (Pb(Zr, Ti) $O_3$), $HfO_2$, $La_2O_3$, and MgO, diffusion bonding cannot be performed due to the brittleness of the materials and other issues on material characteristics. Thus, a sputtering target-backing plate assembly formed from these materials is still being produced using the brazing method.

Japanese Unexamined Patent Application Publication No. H7-48667 describes that a Si target is bonded to a Cu or Cu alloy backing plate with an In or In—Sn alloy solder. Japanese Unexamined Patent Application Publication No. 2016-37621 discloses that indium, an In—Sn alloy (Sn: 60 to 90 at %) or a Sn—Ag alloy (Ag: 3 to 20 at %) is used as a brazing material upon bonding such a target material as a semiconductor material, an oxide material, a metal material, or a silicon carbide material.

However, there was a problem in cases where bonding is performed by using such a low melting point material as indium as a bonding material (also referred to as a "brazing material"). When sputtering is performed at a high power in order to increase the sputter rate, the brazing material begins to melt due to the high temperature of sputtering and cause the target to be separated from the backing plate during deposition. Meanwhile, when a material having a melting point higher than that of indium is used as a brazing material, there was a problem in that the wettability with the Si target becomes low and the bonding strength would deteriorate.

SUMMARY

An embodiment of the present invention was devised to resolve the foregoing problems, and an object of this invention is to provide a sputtering target-backing plate assembly in which a Si sputtering target is bonded to a backing plate using a brazing material, wherein the sputtering target-backing plate assembly has a high bonding strength and is free from separation even under high temperature sputtering conditions such as during high power sputtering.

In order to resolve the above issues, the present inventors conducted intense studies and found that a sputtering target-backing plate assembly with a high bonding strength even under high temperature sputtering conditions such as during high power sputtering can be obtained by using a brazing material having a melting point of 200° C. or higher, adjusting the surface roughness on the side of the sputtering target to which the brazing material is applied, modifying such surface by performing ultrasonic welding thereto, and thereafter applying the brazing material thereto.

Based on the above findings and results, provided is the following embodiment of the invention. A sputtering target-backing plate assembly in which a Si sputtering target is bonded to a backing plate using a brazing material, wherein the brazing material has a melting point of 200° C. or higher and a bonding strength of 0.16 $kgf/cm^2$ or higher. The sputtering target-backing plate assembly may have a surface roughness Ra on a side of the sputtering target to which the brazing material is applied of 0.1 μm or more and 1.2 μm or less.

The following embodiment of the invention is also provided. A method of producing a sputtering target-backing plate assembly, wherein a surface roughness Ra of a bonding surface of a Si sputtering target is caused to be 0.1 μm or more and 1.2 μm or less, ultrasonic welding treatment is performed to the bonding surface, a brazing material having a melting point of 200° C. or higher is applied thereto, and the sputtering target is subsequently bonded to a backing plate via the brazing material.

The sputtering target-backing plate assembly of the embodiment of the present invention yields a superior effect of enabling to exhibit a high bonding strength between the sputtering target and the backing plate and prevent separation even under high temperature sputtering conditions such as during high power sputtering. Through the use of such an assembly, high speed deposition based on high power sputtering becomes possible, and considerably improves the productivity.

DETAILED DESCRIPTION

A Si sputtering target is normally bonded to a backing plate by using a brazing material. A material having a low melting point has conventionally been used as the brazing material so as to facilitate brazing, such as indium having a melting point of 157° C. and a Sn—In alloy having a melting point of roughly 120° C. have been used, Nevertheless, in recent years, sputtering is being performed with higher power in order to increase the sputter rate, and the thermal load on the target is also becoming greater in comparison to conventional processes. Thus, a problem occurs in that the brazing material which bonds between the target and the backing plate begins to melt, and separation occurs between the target and the plate.

According to an embodiment of the present invention, the problem of the melting of the brazing material during sputtering can be prevented by using a brazing material having a melting point of 200° C. or higher. As the brazing material having a melting point of 200° C. or higher, preferably used is tin (melting point: 232° C.), or a tin alloy such as Sn—Ag—Cu, Sn—Bi—Cu, Sn—Sb, Sn—Zn—Bi, or Sn—Zn—Al. By using these types of brazing materials, brazing materials does not melt even with the thermal load based on the high-power sputtering of these days, and it is possible to maintain a high bonding strength of the sputtering target and the backing plate.

Meanwhile, the bonding strength may deteriorate in certain cases because the foregoing brazing materials have low wettability to Si (i.e., sputtering target). Thus, the embodiment of the present invention increases the bonding strength by properly adjusting the surface roughness of the surface of the sputtering target, which is the surface on the side to which the brazing material is applied. In the embodiment, the surface roughness Ra (arithmetic mean roughness) is preferably set to 0.1 μm or more and 1.2 μm or less. When the surface roughness Ra is less than 0.1 μm, separation may occur during cooling after bonding. When the surface roughness Ra exceeds 1.2 μm, the wettability will contrarily deteriorate, and the brazing material cannot be uniformly applied.

In order to further increase the wettability to Si, it would be preferable to perform modification treatment to the surface before applying the brazing material. As the modification method, it would be effective to perform ultrasonic welding, that is, to press a horn that generates ultrasonic waves on the surface to which the brazing material is applied and applies ultrasonic vibration to the surface.

It is considered that ultrasonic welding yields modification effects as a result of the following working independently or integrally; specifically, 1) as a result of destroying the inert layer (oxide film or foreign matter that causes the wettability to deteriorate) of the outermost surface based on the ultrasonic vibrational energy from an oscillator and creating an active surface, it is possible to ensure the wettability of the bonding of the brazing material and the base metal, 2) by activating the vibrational energy of the bonding surface (outermost surface) of the brazing material and the base metal, the physical bonding between the brazing material and the base metal is facilitated and a state similar to diffusion bonding is thereby created, and 3) certain brazing materials leverage bonding with an oxide film on the outermost surface, and the bonding is facilitated by eliminating, via vibration, air layers and the like that entered the micro irregularities between the brazing material and the base metal.

By the above-mentioned way, a sputtering target-backing plate assembly having a high bonding strength of 0.16 kgf/cm$^2$ or more can be obtained.

According to the embodiment of the present invention, it is possible to cause the bonding surface area ratio of the sputtering target and the backing plate to be 97% or higher. Here, the bonding surface area ratio refers to the area ratio of the brazing material existing on the bonding surface of the sputtering target and the backing plate based on ultrasonic flaw detection inspection, and, when the bonding surface is completely covered with the brazing material, the bonding surface area ratio is 100%. Even in cases where the brazing material is uniformly applied on the bonding surface of the sputtering target, the bonding surface area ratio may not become 100% depending on the surface texture. As the wettability is more favorable, the bonding surface area ratio will increase, and contribute to the increase in the bonding strength.

Preferably used for the backing plate is a material having a favorable thermal conductivity which alleviates the rise in temperature of the sputtering target and can be stably mounted on a sputtering device, in addition to having a certain level of strength. Specifically, copper or a copper alloy, aluminum or an aluminum alloy, titanium or a titanium alloy, molybdenum or a molybdenum alloy, or stainless steel (SUS) can be used as the backing plate. From the perspective of bonding strength, in particular copper or a copper alloy, or molybdenum or a molybdenum alloy is preferably used, and, from the perspective of thermal expansion properties, in particular molybdenum or a molybdenum alloy is preferably used. Meanwhile, as the sputtering target, silicon (Si) or a material having Si as its main component is used. The bonding method of the embodiment of the present invention may be applied irrespective of whether the Si is monocrystalline or polycrystalline.

Measurement Method of Bonding Strength

A test piece was prepared based on JISZ2241:2011 and subject to a tensile test, and the bonding strength was measured. Specifically, a prismatic test piece in which one side is 6 mm or more or a cylindrical test piece having a diameter of 6 mm or more was acquired from the sputter target-backing plate assembly by using a water jet or a cutter, and the obtained test pieces were subsequently subject to a tensile test. Because the length of the test piece normally corresponds to the thickness of the assembly, the grip section (chuck part) to be pulled is sometimes processed as needed. In the foregoing case, the overall test piece is preferably 10 mm or more centered around the bonded part. Because the bonding strength sometimes differs according to the position to be sampled, it is preferable to acquire a plurality of (for instance, five) test pieces, and obtain the mean value of the bonding strength. Here, in order to reduce the deviation depending on the location, for instance, it is preferable to acquire test pieces from the outer periphery (2 points), the point that is ½ of the radius (2 points), and the center part (1 point) of the assembly.

Measurement Method of Surface Roughness

The surface roughness was measured with a contactless surface roughness meter, and as the parameter, the arithmetic mean roughness Ra prescribed in JISB0601:2013 was used. Since the surface roughness may differ depending on the measured location, it is preferable to measure at a plurality of (for instance, five) locations, and obtain the mean value of the surface roughness. Here, in order to reduce the deviation depending on the location, for instance, it is preferable to measure the surface roughness at the outer periphery (4 points), the point that is ½ of the radius (4 points), and the center part (1 point) of the assembly. Note that, upon measuring the surface roughness of the sputtering target bonded to the backing plate, the surface roughness of the bonding surface can be measured by removing the brazing material from the bonding surface after the de-bonding (separation) of the target. Here, because the Si target and the brazing material have low wettability, the brazing material is repelled during de-bonding, and only a small amount of the brazing material, or hardly any brazing material, will remain on the bonding surface of the target.

EXAMPLES

The embodiment of the present invention is now explained based on the Example and Comparative Examples. Note that the following Examples are merely illustrative, and the embodiment of the present invention are not limited to these Examples. In other words, other modes and modified examples are also covered by the embodiment of the present invention.

Example 1

A bonding surface of a Si sputtering target (surface to be bonded with a backing plate) was subject to finish processing using a rotary surface grinding machine to attain a surface roughness Ra of 0.1 μm. Next, the bonding surface was subject to surface modification via ultrasonic welding treatment, and molten Sn (melting point: 232° C.) was thereafter applied thereto. Subsequently, the sputtering target as bonded to a Cu alloy backing plate via a brazing material made from Sn to prepare a sputtering target-backing plate assembly. After the bonding, the assembly was examined as to whether separation occurred or not, but no separation was observed. Next, ultrasonic flaw detection inspection was performed to measure the area ratio (bonding surface area ratio) of the brazing material at the bonded interface, and the result was a high numerical value of 98.1%. As a result of subjecting the assembly to a tensile test, the obtained assembly had a high strength of 0.20 kgf/cm². Next, sputtering was performed under predetermined sputtering conditions in which separation occurred upon using In as the brazing material, and it was confirmed that the assembly could be used sufficiently.

Examples 2 and 3

A bonding surface of a Si sputtering target was subject to finish processing via rotary surface grinding to attain a surface roughness Ra of 0.6 μm (Example 2) and 1.2 μm (Example 3), respectively. Next, the respective bonding surfaces were subject to surface modification via ultrasonic welding treatment, and molten Sn (melting point: 232° C.) was thereafter applied thereto. Subsequently, the respective sputtering targets were bonded to a Cu alloy backing plate via a brazing material made from Sn to prepare a sputtering target-backing plate assembly. After the bonding, the respective assembly was examined as to whether separation occurred or not, but no separation was observed in either case. Next, ultrasonic flaw detection was performed to measure the area ratio (bonding surface area ratio) of the brazing material at the bonded interface, and the result was a high numerical value of 97% in both cases. Then the assemblies were subjected to a tensile test, and the obtained assemblies had a high strength at 0.31 kgf/cm² (Example 2) and 0.16 kgf/cm² (Example 3), respectively. Next, sputtering was performed under predetermined sputtering conditions in which separation occurred upon using In as the brazing material, and it was confirmed that both assemblies could be used sufficiently.

Examples 4 and 5

A bonding surface of a Si sputtering target was subject to finish processing via rotary surface grinding to attain a surface roughness 0.4 μm (Example 4) and 0.9 μm (Example 5), respectively. Next, the respective bonding surfaces were subject to surface modification via ultrasonic welding treatment, and a brazing material made from a Sn—Cu alloy (melting point 227° C.) was applied in Example 4, and a brazing material made from a Sn—Zn—Sb alloy (melting point 217° C.) was applied in Example 5. Subsequently, the sputtering targets were bonded to a Cu alloy backing plate via their respective brazing materials to prepare a sputtering target-backing plate assembly. After the bonding, the respective assembly was examined as to whether separation occurred or not, but no separation was observed in either case. Next, ultrasonic flaw detection was performed to measure the area ratio (bonding surface area ratio) of the brazing material at the bonded interface, and the result was a high numerical value of 97% in both cases. Then the assemblies were subjected to a tensile test, and the obtained assemblies had a high strength at 0.24 kgf/cm² (Example 4) and 0.66 kgf/cm² (Example 5), respectively. Next, sputtering was performed under predetermined sputtering conditions in which separation occurred upon using In as the brazing material, and it was confirmed that both assemblies could be used sufficiently.

Comparative Examples 1 and 2

A bonding surface of a Si sputtering target was subject to finish processing via mirror polish to attain a surface roughness Ra of 0.008 μm in Comparative Example 1, and subject to finish processing via blast treatment to attain a surface roughness Ra of 2.4 μm in Comparative Example 2, respectively. Next, the respective bonding surfaces were subject to surface modification via ultrasonic welding treatment, and molten Sn (melting point: 232° C.) was thereafter applied thereto. Next, the respective sputtering targets were bonded to a Cu alloy backing plate via a brazing material made from Sn to prepare a sputtering target-backing plate assembly. Note that, in Comparative Example 2, because the wettability with the brazing material was low and the brazing material could not be properly applied, the sputtering target could not be bonded to the backing plate. With regard to Comparative Example 1, after the bonding, the assembly was examined as to whether separation occurred or not, and the sputtering target could be easily separated from the backing plate by hand; that is, the sputtering target was in a state where it could be easily separated with minimal impact. Because the bonding was insufficient, the subsequent tests such as adhesiveness or bonding strength were not conducted.

Comparative Example 3

A bonding surface of a Si sputtering target (surface to be bonded with a backing plate) was subject to finish processing using a rotary surface grinding machine to attain a surface roughness Ra of 1.0 μm. Next, molten Sn (melting point: 232° C.) was thereafter applied thereto. Here, surface modification treatment such as ultrasonic welding was not performed. Next, the sputtering target was bonded to a Cu alloy backing plate via a brazing material made from Sn to prepare a sputtering target-backing plate assembly. After the bonding, the assembly was examined as to whether separation occurred or not, and the sputtering target was in a state where it could be easily separated with minimal impact. Because the bonding was insufficient, the subsequent tests such as adhesiveness or bonding strength were not conducted.

Comparative Example 4

A bonding surface of a Si sputtering target (surface to be bonded with a backing plate) was subject to finish processing using a rotary surface grinding machine to attain a surface roughness Ra of 0.4 μm. Next, Sn was thermally sprayed on the bonding surface to form a thick Sn film, and this was used as the brazing material. Nevertheless, because Sn could not be thermally sprayed on Si properly and the thermal spray coating became separated, the sputtering target could not be bonded to the backing plate.

Comparative Example 5

A bonding surface of a Si sputtering target (surface to be bonded with a backing plate) was subject to finish processing using a rotary surface grinding machine to attain a surface roughness Ra of 0.5 μm. Next, Sn was vapor-deposited on the bonding surface to form a Ni thin film, and molten Sn (melting point 232° C.) was applied thereon. Nevertheless, because the wettability with the brazing material was low and the brazing material could not be properly applied, the sputtering target could not be bonded to the backing plate.

TABLE 1

| | Brazing material | Melting point of brazing material/° C. | Surface finish | Surface roughness | Surface modification, etc. | Separation after bonding | Adhesiveness (o is indicated when bonded area ratio was 97% or more) | Bonding strength (tensile test) |
|---|---|---|---|---|---|---|---|---|
| Example 1 | Sn | 232 | Rotary finish | 0.1 μm | Ultrasonic welding | None | o | 0.20 kgf/cm2 |
| Example 2 | | | Rotary finish | 0.6 μm | | None | o | 0.31 kgf/cm2 |
| Example 3 | | | Rotary finish | 1.2 μm | | None | o | 0.16 kgf/cm2 |
| Example 4 | Sn—0.7Cu | 227 | Rotary finish | 0.4 μm | Ultrasonic welding | None | o | 0.24 kgf/cm2 |
| Example 5 | 90Sn—10(ZnSb) | 217 | Rotary finish | 0.9 μm | Ultrasonic welding | None | o | 0.66 kgf/cm2 |
| Comparative Example 1 | Sn | 232 | Mirror polish | 0.008 μm | Ultrasonic welding | Separation upon cooling after bonding | x | — |
| Comparative Example 2 | | | Blast finish | 2.4 μm | | Brazing material could not be applied due to deterioration in wettability with brazing material | x | — |
| Comparative Example 3 | | | Rotary finish | 1.0 μm | None | Separation upon cooling after bonding | x | — |
| Comparative Example 4 | | | Rotary finish | 0.4 μm | Sn thermal spray | Sn thermal spray could not be applied on Si, and sprayed coating peeled | x | — |
| Comparative Example 5 | | | Rotary finish | 0.5 μm | Ni vapor deposition | Brazing material could not be applied due to deterioration in wettability with brazing material | x | — |

The sputtering target-backing plate assembly of the embodiment of the present invention yields a superior effect of enabling to exhibit a high bonding strength between the sputtering target and the backing plate and prevent separation even under high temperature sputtering conditions such as during high power sputtering. The sputtering target-backing plate assembly of the embodiment of the invention is effective for forming thin films of semiconductor devices, and particularly effective for high-speed deposition based on high power sputtering.

We claim:

1. A sputtering target-backing plate assembly, comprising a Si sputtering target bonded to a backing plate with a brazing material, wherein the backing plate is made of copper, copper alloy, aluminum, aluminum alloy, titanium, titanium alloy, molybdenum, molybdenum alloy, or stainless steel, wherein said brazing material is present between the Si sputtering target and the backing plate, wherein the brazing material consists of Sn-0.7Cu or 90Sn-10(ZnSb), wherein said sputtering target-backing plate assembly has a bonding strength of 0.24 kgf/cm$^2$ or higher, and wherein a surface roughness Ra of a face of the Si sputtering target to which the brazing material is applied is 0.1 μm or more and 1.2 μm or less.

2. The sputtering target-backing plate assembly according to claim 1, wherein the brazing material has a melting point of 217° C. to 227° C.

3. The sputtering target-backing plate assembly according to claim 1, wherein the sputtering target-backing plate assembly consists of the Si sputtering target, the backing plate, and the brazing material.

4. The sputtering target-backing plate assembly according to claim 1, wherein said face of the Si sputtering target to which the brazing material is applied is a surface having been modified by ultrasonic welding treatment.

5. The sputtering target-backing plate assembly according to claim 1, wherein a bonding surface area ratio of the sputtering target-backing plate assembly is 97% or higher, wherein the bonding surface area ratio refers to an area ratio of where the brazing material is present between bonding surfaces of the sputtering target and the backing plate.

6. The sputtering target-backing plate assembly according to claim 1, wherein a main component of the Si sputtering target is silicon (Si).

7. The sputtering target-backing plate assembly according to claim 1, wherein the Si sputtering target consists of silicon (Si).

8. A method of producing the sputtering target-backing plate assembly according to claim 1, comprising the steps of:
providing the Si sputtering target having the face providing the bonding surface with the surface roughness Ra of 0.1 μm or more and 1.2 μm or less and the backing plate made of copper, copper alloy, aluminum, aluminum alloy, titanium, titanium alloy, molybdenum, molybdenum alloy, or stainless steel;

performing ultrasonic welding treatment to the bonding surface of the Si sputtering target;

applying the brazing material that consists of Sn-0.7Cu or 90Sn-10(ZnSb) to the bonding surface; and bonding the Si sputtering target to the backing plate via the brazing material such that the brazing material is present between the Si sputtering target and the backing plate and such that the sputtering target-backing plate assembly has a bonding strength of 0.24 $kgf/cm^2$ or higher.

* * * * *